(12) United States Patent
Kang

(10) Patent No.: US 10,090,418 B2
(45) Date of Patent: Oct. 2, 2018

(54) SOLAR BATTERY MODULE

(71) Applicant: LG INNOTEK CO., LTD., Seoul (KR)

(72) Inventor: Kyung Ho Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/022,794

(22) PCT Filed: Sep. 17, 2014

(86) PCT No.: PCT/KR2014/008661
§ 371 (c)(1),
(2) Date: Mar. 17, 2016

(87) PCT Pub. No.: WO2015/041466
PCT Pub. Date: Mar. 26, 2015

(65) Prior Publication Data
US 2016/0233346 A1 Aug. 11, 2016

(30) Foreign Application Priority Data
Sep. 17, 2013 (KR) .................. 10-2013-0111654

(51) Int. Cl.
H01L 31/042 (2014.01)
H01L 31/02 (2006.01)
H01L 31/048 (2014.01)
H02S 40/36 (2014.01)
H02S 40/34 (2014.01)
H01L 31/0224 (2006.01)
H01L 31/05 (2014.01)

(52) U.S. Cl.
CPC .... *H01L 31/0201* (2013.01); *H01L 31/02008* (2013.01); *H01L 31/022425* (2013.01);
(Continued)

(58) Field of Classification Search
CPC ............ H01L 31/02013; H01L 31/048; H01L 31/022425; H01L 31/02008; H02S 40/36
(Continued)

(56) References Cited

U.S. PATENT DOCUMENTS 6,133,521 A * 10/2000 Haga ................. H01L 31/02008
136/251
6,320,115 B1 * 11/2001 Kataoka ................. B32B 17/04
136/251
(Continued)

FOREIGN PATENT DOCUMENTS

JP     08246627 A     9/1996
JP     2001148486 A   5/2001
WO    WO-2013073863 A1 5/2013

OTHER PUBLICATIONS

English translation of Sasaki et al., JP08-246627.*
(Continued)

*Primary Examiner* — Jeffrey T Barton
*Assistant Examiner* — Niki Bakhtiari
(74) *Attorney, Agent, or Firm* — Saliwanchik, Lloyd & Eisenschenk

(57) ABSTRACT

A solar battery module according to one embodiment comprises: a support substrate having a through-hole formed therein; a plurality of solar battery cells arranged on the support substrate; a busbar which is electrically connected to the solar battery cells; a first connection member which is inserted in the through-hole; and a second connection member which is connected to the first connection member, wherein the second connection member comprises a contact member that contacts the busbar through the through-hole.

17 Claims, 2 Drawing Sheets

(52) U.S. Cl.
CPC ............ *H01L 31/048* (2013.01); *H01L 31/05* (2013.01); *H02S 40/34* (2014.12); *H02S 40/36* (2014.12); *Y02E 10/50* (2013.01)

(58) Field of Classification Search
USPC ................................................ 136/243–265
See application file for complete search history.

(56) References Cited

U.S. PATENT DOCUMENTS

| | | |
|---|---|---|
| 2002/0056473 A1 | 5/2002 | Chandra et al. |
| 2005/0000561 A1* | 1/2005 | Baret .................... H01L 31/048 136/244 |
| 2007/0084501 A1 | 4/2007 | Kalberlah et al. |
| 2009/0139567 A1* | 6/2009 | Liu ................... H01L 31/02008 136/256 |
| 2012/0279855 A1 | 11/2012 | Pinarbasi et al. |
| 2014/0305488 A1 | 10/2014 | Kim |

OTHER PUBLICATIONS

International Search Report in International Application No. PCT/KR2014/008661, filed Sep. 17, 2014.

Office Action dated Feb. 6, 2017 in Chinese Application No. 201480056135.8.

* cited by examiner

【Figure 1】
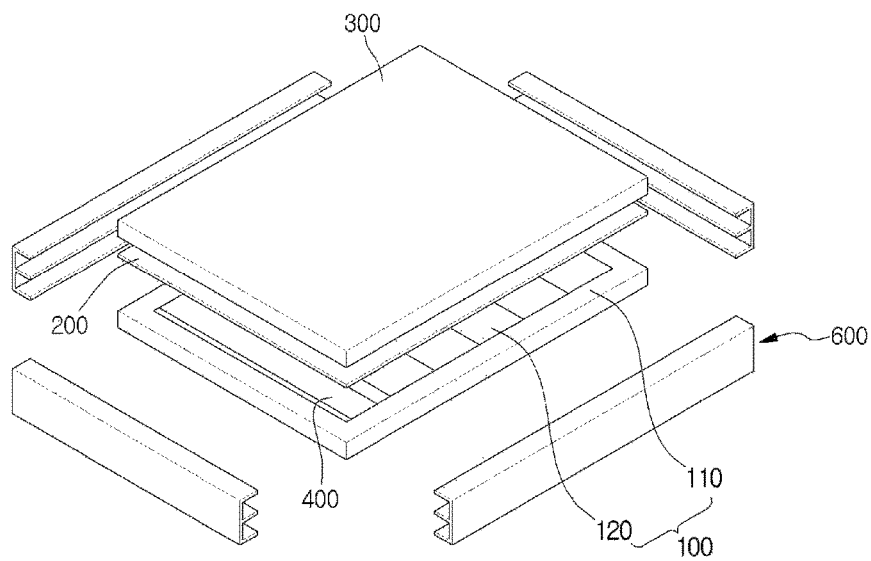
【Figure 2】
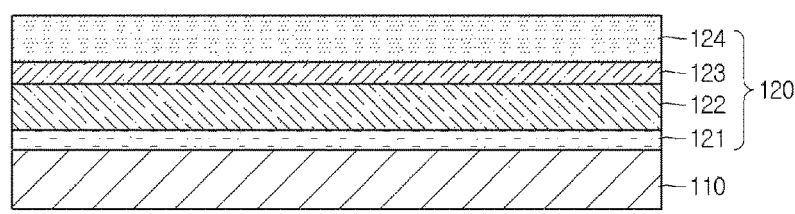
【Figure 3】
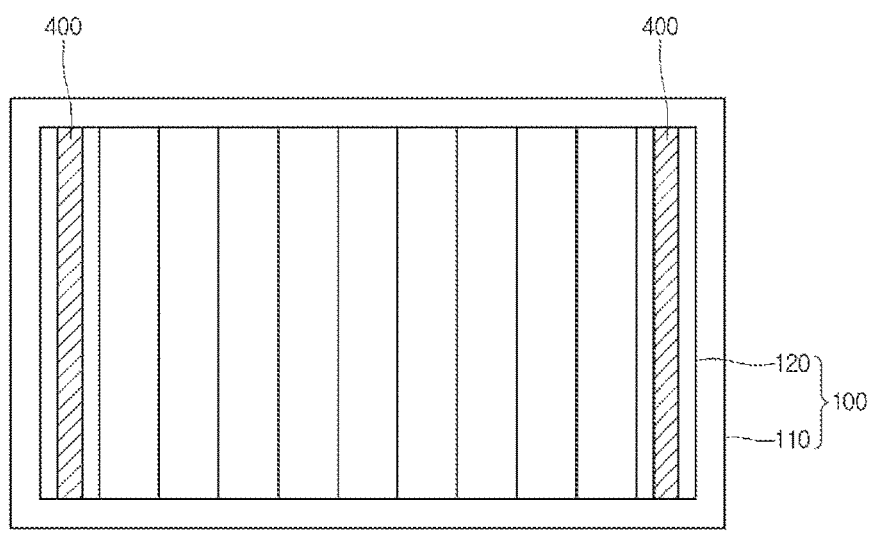

【Figure 4】
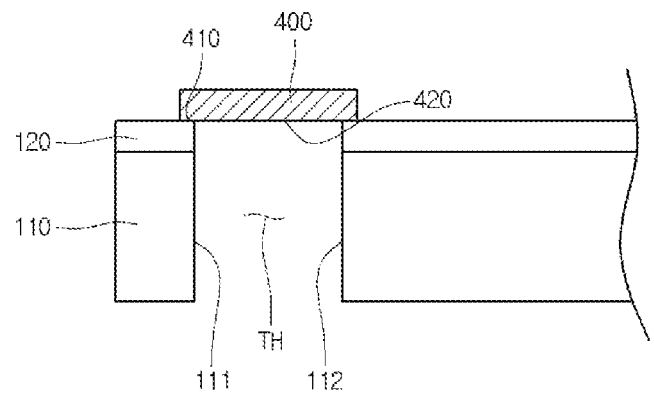
【Figure 5】
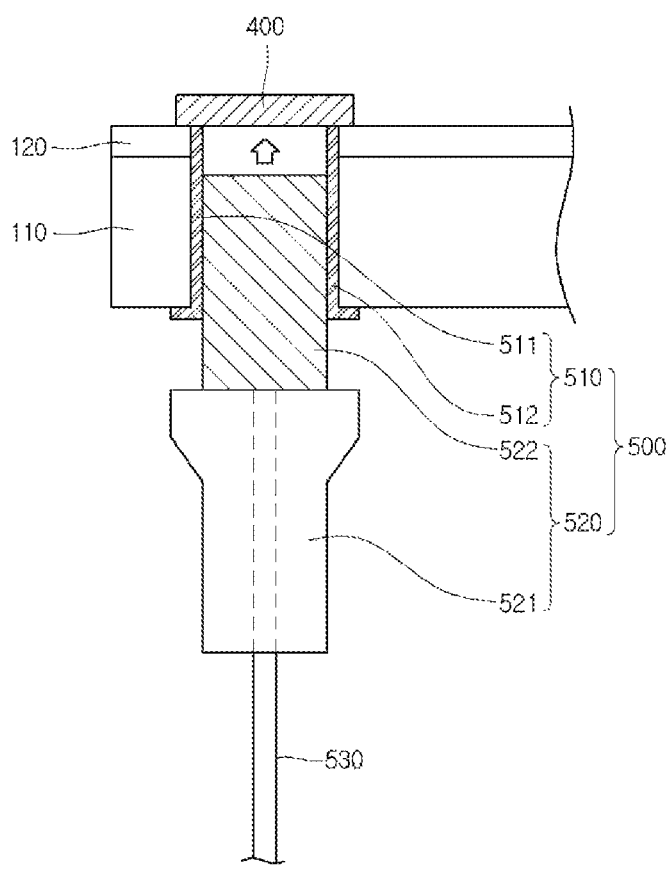

SOLAR BATTERY MODULE

CROSS-REFERENCE TO RELATED APPLICATIONS

This application is the U.S. national stage application of international Patent Application No. PCT/KR2014/008661, filed Sep. 17, 2014, which claims priority to Korean Application No. 10-2013-0111654, filed Sep. 17, 2013, the disclosures of each of which are incorporated herein by reference in their entirety.

BACKGROUND

1. Field

Embodiments relate to a solar battery module.

2. Background

Recently, as depletion of conventional energy resources such as oil and coal has been predicted and interests in alternative energy to replace them are increasing, a solar battery that produces electric energy from solar energy has entered the spotlight.

The solar battery (a solar cell or a photovoltaic cell) is a key element of solar photovoltaic power generation in which sunlight is directly converted into electricity.

As an example, when sunlight having energy greater than band-gap energy (Eg) of a semiconductor is incident on a solar battery made of a p-n junction of the semiconductor, electron-hole pairs are generated, electrons of the electron-hole pairs are gathered at an n layer and holes are gathered at a p layer due to an electric field formed on the p-n junction, and thus an electromotive force (a photoelectron motive force or a photovoltage) between the p and the n occurs. In this case, an operational principle is that a current flows when a load is connected to electrodes at both ends.

A current generated in the solar battery is connected to a junction box through a busbar. Generally, the busbar is formed on a front surface of a solar battery panel, crosses to a rear surface of the panel through a hole formed in the panel, and is connected to the junction box.

However, in order to insert the busbar in the hole, a process of folding the busbar at a right angle on a support substrate is required, and the process may cause problems such as thickness inconsistency, stripping of film, cracks, and the like in a folded portion of the busbar.

Therefore, when the busbar is formed in the solar battery panel, a solar battery module having a new structure capable of improving the durability and reliability thereof is required.

SUMMARY

Embodiments provide a solar battery module capable of being manufactured easily and having improved reliability and durability.

A solar battery module according to an embodiment includes a support substrate having a through-hole formed therein, a plurality of solar battery cells disposed on the support substrate, a busbar which is electrically connected to the solar battery cells, a first connection member which is inserted in the through-hole, and a second connection member which is connected to the first connection member, wherein the second connection member includes a contact member in contact with the busbar through the through-hole.

BRIEF DESCRIPTION OF THE DRAWINGS

Embodiments will be described in detail with reference to the following drawings in which like reference numerals refer to like elements, and wherein:

FIG. 1 is an exploded perspective view illustrating a solar battery module according to an embodiment;

FIG. 2 is a view illustrating a cross section of the solar battery according to the embodiment;

FIG. 3 is a view illustrating a top surface of a solar battery panel in the solar battery module according to the embodiment;

FIG. 4 is a view illustrating a side surface of the solar battery panel in the solar battery module according to the embodiment; and FIG. 5 is a view illustrating the side surface of the solar battery panel in which a connection member is connected to a through-hole according to the embodiment.

DETAILED DESCRIPTION

In the description of the embodiments, a layer (film), region, pattern, or structure being referred to as being "on/above" or "under/below" a substrate, a layer (film), region, or patterns includes directly being formed thereupon or being an intervening layer. References with respect to "on/above" or "under/below" of each layer will be described based on the drawings.

The thicknesses or sizes of layers (films), regions, patterns, or structures in the drawings may be modified for the sake of clarity and convenience and do not completely reflect actual thicknesses or sizes.

Hereinafter, embodiments of the present invention will be described in detail with reference to the accompanying drawings.

Hereinafter, a solar battery module according to an embodiment will be described in detail with reference to FIGS. 1 to 5. FIG. 1 is an exploded perspective view illustrating the solar battery module according to the embodiment, FIG. 2 is a view illustrating a cross section of the solar battery according to the embodiment, FIG. 3 is a view illustrating a top surface of a solar battery panel in the solar battery module according to the embodiment, FIG. 4 is a view illustrating a side surface of the solar battery panel in the solar battery module according to the embodiment, and FIG. 5 is a side view illustrating the side surface of the solar battery panel in which a connection member is connected to a through-hole according to the embodiment.

Referring to FIGS. 1 to 5, the solar battery module according to the embodiment includes a solar battery panel 100, a protective layer 200 disposed on the solar battery panel 100, an upper substrate 300 disposed on the protective layer 200, busbars 400 disposed on the solar battery panel 100, connection members 500 connected to the busbars 400, and a frame 600.

The solar battery panel 100 may have a plate shape. The solar battery panel 100 may include a support substrate 110 and a plurality of solar batteries 120 disposed on the support substrate 110.

The support substrate 110 may include an insulator. The support substrate 110 may be a glass substrate, a plastic substrate, or a metal substrate. Specifically, the support substrate 110 may be a soda lime glass substrate. Alternatively, a ceramic substrate such as alumina, stainless steel, a flexible polymer, and the like may be used as a material of the support substrate 110. The support substrate 110 may be transparent. The support substrate 110 may be rigid or flexible.

A through-hole TH may be formed in the support substrate 110. Specifically, a plurality of through-holes TH may be formed in the support substrate 110. At least two through-holes TH may be formed. Further, the through-holes TH may be formed to pass through a portion of the solar battery 120 disposed on the support substrate 110.

Each of the solar batteries 120 may be, for example, a CIGS-based solar battery, a silicon-based solar battery, a dye-sensitized-based solar battery, a III-IV group compound semiconductor solar battery, or a III-V group compound semiconductor solar battery.

For example, referring to FIG. 2, the solar battery 120 may be a CIGS-based solar battery. Specifically, the solar battery 120 may include a rear electrode layer 121 disposed on the support substrate 110, a light-absorbing layer 122 disposed on the rear electrode layer 121, a buffer layer 123 disposed on the light-absorbing layer 122, and a front electrode layer 124 disposed on the buffer layer 123. The above-described through-hole TH may be formed to pass through the support substrate 110 and the rear electrode layer 121.

The rear electrode layer 121 may be a conductive layer. For example, a material used as the rear electrode layer 121 may include a metal such as molybdenum and the like.

The light-absorbing layer 122 may include an group based compound. For example, the light-absorbing layer 122 may have a copper-indium-gallium-selenide-based (Cu(In,Ga)Se2;CIGS-based) crystal structure, a copper-indium-selenide-based crystal structure, or a copper-gallium-selenide-based crystal structure.

The buffer layer 123 may include cadmium sulfide (CdS), zinc oxide (ZnO), or the like.

The front electrode layer 124 may include an oxide. For example, a material used as the front electrode layer 124 may include aluminum doped zinc oxide (Al doped ZnO; AZO), indium zinc oxide (IZO), indium tin oxide (ITO), or the like.

The solar batteries 120 may be disposed in a stripe pattern. Further, the solar batteries 120 may be disposed in various forms such as a matrix form or the like.

The protective layer 200 for protecting the solar battery panel 100 and the upper substrate 300 may be disposed on the solar battery panel 100.

The protective layer 200, which is integrated with the solar battery panel 100 by a lamination process while being disposed on the solar battery panel 100, prevents the solar battery panel 100 from being corroded due to moisture penetration, and protects the solar battery panel 100 from shocks. The protective layer 200 may be formed of a material such as ethylene vinyl acetate (EVA). The protective layer 200 may also be formed under the solar battery panel 100.

The upper substrate 300 disposed on the protective layer 200 may be formed of a tempered glass having a high transmittance and an excellent breakage protection function. In this case, the tempered glass may be a low iron tempered glass with low iron content. An embossing process may be performed on an inner side surface of the upper substrate 300 in order to increase a scattering effect of light.

The frame 600 is disposed on an outside of the solar battery panel 100. The frame 600 may accommodate the solar battery panel 100, the protective layer 200, and the upper substrate 300. Specifically, the frame 600 may surround side surfaces of the solar battery panel 100.

For example, the frame 600 may be a metal frame. Specifically, the frame 600 may include various metals such as aluminum, stainless steel, iron, and the like.

The busbars 400 may be disposed on the solar battery panel 100. At least two busbars 400 may be included. The busbars 400 may be connected to the solar batteries 120. Specifically, the busbars 400 may be directly connected to the solar batteries 120. More specifically, the busbars 400 may be connected to each of the outermost solar batteries. For example, the busbar 400 may be disposed on the rear electrode layer 121 of the solar battery 120 and connected to the solar battery 120.

The busbar 400 may include a conductive tape or a conductive paste. For example, a material used as the busbar 400 may include at least one metal of copper, silver, aluminum, tin, lead, and an alloy thereof.

Referring to FIG. 4, the busbar 400 may be disposed to pass through the through-hole TH region formed on the support substrate 110. That is, at least one surface of the busbar 400 may be exposed at a lower surface of the support substrate 110 by the through-hole TH. Accordingly, the busbar 400 may include a first surface 410 in contact with the rear electrode layer 121 and a second surface 420 disposed in the rear electrode layer 121. The second surface 420 of the busbar 400 may be exposed by the through-hole TH.

As the through-hole TH passes through the support substrate 110, an inner side surface of the support substrate 110 may be exposed. Specifically, the support substrate 110 may include a first inner side surface 111 and a second inner side surface 112 which are exposed by the through-hole TH.

Referring to FIG. 5, the connection member 500 may include a first connection member 510 and a second connection member 520.

The first connection member 510 may be disposed in the through-hole TH. Specifically, the first connection member 510 may include a first connection unit 511 in contact with the first inner side surface 111 of the through-hole TH and a second connection unit 512 in contact with the second inner side surface 112 of the through-hole TH.

The second connection member 520 may include a main body 521 and a contact member 522. The main body 521 may support the contact member 522. The contact member 522 may be inserted in the through-hole TH. Specifically, the contact member 522 may be in contact with the first connection member 510 disposed in the through-hole TH, and may be inserted in the through-hole TH. More specifically, the contact member 522 may be in contact with the first connection unit 511 and the second connection unit 512 of the first connection member 510 which are disposed in the through-hole TH, and may be inserted in the through-hole TH.

The contact member 522 may be disposed to be fixed in the through-hole TH by the first connection unit 511 and the second connection unit 512. Specifically, at least one of the first connection unit 511 and the second connection unit 512 is formed in a female screw shape or a male screw shape, and the contact member 522 may have a shape complementary to the at least one connection unit of the first connection unit 511 and the second connection unit 512. That is, on the other hand, the contact member 522 may be formed in a male screw shape or a female screw shape, and the first connection member 510 and the contact member 522 may be connected in female and male pairs. Accordingly, the contact member 522 may be disposed to be detachably fixed into the through-hole.

The contact member 522 may include a conductive material. Specifically, the contact member 522 may include a conductive material such as a metal. For example, the contact member 522 may include at least one of aluminum (Al), nickel (Ni), and an alloy thereof.

The contact member 522 may be in contact with the busbar 400 exposed by the through-hole TH. Specifically, a surface of the busbar 400, which is formed on the solar battery panel 100 and exposed by the through-hole TH, may be in contact with the contact member 522 which is disposed to be fixed to the through-hole TH.

Accordingly, the contact member 522 may be in electrical contact with the busbar 400. That is, the contact member 522 and the busbar 400 may be electrically connected.

The contact member 522 may be connected to the main body 521, the main body 521 may include wiring 530 connected to the contact member 522, and the wiring 530 may be connected to a connector disposed outside of the solar battery panel 100.

In the solar battery module according to the embodiment, the solar battery module may be easily manufactured, and an efficiency of the solar battery may be improved.

Conventionally, a busbar may be formed on a solar battery panel, the busbar may pass through a through-hole formed on a support substrate to move to a rear surface of the support substrate and may be connected to a junction box disposed on the rear surface of the support substrate. In this case, the busbar may be folded vertically in the process of passing through the through-hole, and at this time, cracks may occur in a portion at which the busbar is folded. Further, the number of processes such as a process of crossing the busbar to the rear surface of the support substrate and the like is increased, and thus there is a problem in that process efficiency is reduced.

Accordingly, in the solar battery module according to the embodiment, the through-hole may be formed on the support substrate without directly crossing the busbar to the rear surface of the support substrate, the busbar is disposed at a position in which the through-hole is formed, a surface of the busbar is exposed at the lower surface of the support substrate, and then the busbar may be electrically connected to a connector using a connection member and the like. That is, the connection member may connect the connector to the busbar while serving as a junction box.

Therefore, since the process of crossing the busbar to the rear surface of the support substrate after vertically folding the busbar may be omitted and the process of folding the busbar is not required, the efficiency of the solar battery can be improved by preventing the busbar from being damaged, and a method of manufacturing the solar battery module can be improved.

In the solar battery module according to the embodiment, a solar battery module can be manufactured easily and an efficiency of the solar battery can be improved.

Conventionally, a busbar may be formed on a solar battery panel, the busbar may pass through a through-hole formed on a support substrate to move to a rear surface of the support substrate, and may be connected to a junction box disposed on the rear surface of the support substrate. In this case, the busbar may be folded vertically in the process of passing through the through-hole, and at this time, cracks may occur in a portion at which the busbar is folded. Further, the number of processes such as a process of crossing the busbar to the rear surface of the support substrate and the like is increased, and thus there is a problem in that process efficiency is reduced.

Accordingly, in the solar battery module according to the embodiment, the through-hole may be formed on the support substrate without directly crossing the busbar to the rear surface of the support substrate, the busbar is disposed at a position in which the through-hole is formed, a surface of the busbar is exposed at the lower surface of the support substrate, and then the busbar may be electrically connected to a connector using a connection member and the like. That is, the connection member may connect the connector to the busbar while serving as a junction box.

Therefore, since the process of crossing the busbar to the rear surface of the support substrate after vertically folding the busbar may be omitted and the process of folding the busbar is not required, the efficiency of the solar battery can be improved by preventing the busbar from being damaged, and a method of manufacturing the solar battery module can be improved.

The features, structures, effects, and the like described in the above-described embodiments include at least one embodiment of the present invention, but the present invention is not limited only to one embodiment. Further, the features, structures, effects, and the like illustrated in each embodiment may be combined or modified to other embodiments by those skilled in the art. Therefore, contents related to the combination or the modification should be interpreted to be included in the scope of the invention.

In addition, while the present invention has been particularly described with reference to exemplary embodiments, the present invention is not limited thereto. It will be understood by those skilled in the art that various modifications and applications, which are not illustrated in the above, may be made without departing from the spirit and scope of the present invention. For example, each component illustrated in the embodiments may be modified and made. It should be interpreted that differences related to these modifications and applications are included in the scope of the invention defined in the appended claims.

What is claimed is:

1. A solar battery module comprising:
   a support substrate;
   a plurality of solar battery cells disposed on the support substrate;
   a bus bar disposed on the solar battery cells and electrically connected to the solar battery cells;
   a first connection member; and
   a second connection member connected to the first connection member;
   wherein each of the plurality of solar battery cells has a through-hole formed and extended into the support substrate,
   wherein the first connection member is inserted in one or more of the through-holes of the plurality of solar battery cells and the second connection member includes a contact member in contact with the bus bar through one or more of the through-holes;
   wherein the contact member is in contact with a first connection unit of the first connection member, a second connection unit of the first connection member, and the bus bar, and extends through the support substrate and the solar battery cells;
   wherein the bus bar is provided on the contact member,
   wherein the bus bar includes a bottom surface in direct contact with top surfaces of the solar battery cells, in direct contact with a top surface of the first connection unit, in direct contact with a top surface of the second connection unit, and in direct contact with a top surface of the contact member;
   wherein the contact member is connected to a main body,
   wherein the main body includes wiring connected to the contact member, and the wiring is connected to a connector disposed outside the solar battery cells;
   wherein the first connection member directly makes contact with the support substrate and the solar battery cells, wherein the main body and the wiring directly contact the contact member, wherein the plurality of solar battery cells comprises: a rear electrode layer disposed on the support substrate, a light absorbing layer disposed on the rear electrode layer, a buffer layer disposed on the light absorbing layer, and a front electrode layer disposed on the buffer layer; and wherein the bus bar directly contacts an upper surface of the front electrode layer.

2. The module according to claim 1, wherein the bus bar is disposed at a region corresponding to a region where one or more of the through-holes are formed, and is disposed on the support substrate.

3. The module according to claim 2, wherein the bus bar includes:
a first surface in direct contact with the solar battery cells; and
a second surface not in direct contact with the solar battery cells,
wherein the second surface of the bus bar is exposed by one or more of the through-holes.

4. The module according to claim 1, wherein:
the support substrate includes a first inner side surface and a second inner side surface both exposed by one or more of the through-holes; and
the first connection member includes:
the first connection unit in contact with the first inner side surface; and
the second connection unit connected to the second inner side surface.

5. The module according to claim 4, wherein:
at least one connection unit of the first connection unit and the second connection unit is formed to have a female screw thread or a male screw thread, and
the contact member is formed to have a thread whose type is complementary to the type of the thread of the at least one connection unit of the first connection unit and the second connection unit.

6. The module according to claim 5, wherein the first connection member and the contact member are connected in female and male pairs.

7. The module according to claim 5, wherein the contact member is disposed in one or more of the through-holes to be detachably fixed thereto.

8. The module according to claim 1, wherein the second connection member is connected to a connector.

9. The module according to claim 1, wherein the contact member includes a conductive material.

10. The module according to claim 9, wherein the conductive material includes a metal.

11. The module according to claim 9, wherein the conductive material includes at least one metal of aluminum (Al), nickel (Ni), and an alloy thereof.

12. The module according to claim 3, wherein:
the bus bar is disposed on the rear electrode layer; and
the rear electrode layer is disposed on one or more of the through-holes and is formed with an opening in a shape corresponding to that of one or more of the through-holes.

13. The module according to claim 1, wherein the bus bar includes a conductive tape or a conductive paste.

14. The module according to claim 13, wherein the bus bar includes at least one metal of copper, silver, aluminum, and an alloy thereof.

15. A solar battery module comprising:
a solar battery panel including a support substrate and a plurality of solar batteries disposed on the support substrate;
a bus bar disposed on the solar battery panel;
a protective layer disposed on the solar battery panel;
an upper substrate disposed on the protective layer; and
a connection member in contact with the bus bar,
wherein:
each of the plurality of solar batteries includes a rear electrode layer, a light-absorbing layer disposed on the rear electrode layer, a buffer layer disposed on the light-absorbing layer, and a front electrode layer disposed on the buffer layer;
a through-hole is formed to pass through the support substrate and the rear electrode layer;
the bus bar is disposed on the rear electrode layer;
the upper substrate is formed of tempered glass,
the connection member includes a first connection member and a second connection member;
the first connection member includes a first connection unit in contact with a first inner side surface of the through-hole and a second connection unit in contact with a second inner side surface of the through-hole;
the second connection member includes a contact member and a main body configured to support the contact member;
wherein the bus bar includes a bottom surface in direct contact with top surfaces of the solar batteries, in direct contact with a top surface of the first connection unit, in direct contact with a top surface of the second connection unit, and in direct contact with a top surface of the contact member;
the bus bar is provided on the contact member; and
the contact member is inserted in the through-hole while being in contact with the first connection unit, the second connection unit, and the bus bar;
wherein the contact member is connected to a main body,
wherein the main body includes wiring connected to the contact member, and the wiring is connected to a connector disposed outside the solar batteries;
wherein the first connection member directly makes contact with the support substrate and the rear electrode layer,
wherein the main body and the wiring directly contact the contact member, and
wherein the bus bar directly contacts an upper surface of the front electrode layer.

16. The module according to claim 15, wherein the protective layer is disposed on the support substrate, surrounding the plurality of solar batteries and the bus bar.

17. The module according to claim 15, wherein:
a width of the bus bar is greater than that of the through-hole; and
a width of the contact member is smaller than that of the through-hole.

* * * * *